US006944197B2

(12) United States Patent
Choa

(10) Patent No.: US 6,944,197 B2
(45) Date of Patent: Sep. 13, 2005

(54) LOW CROSSTALK OPTICAL GAIN MEDIUM AND METHOD FOR FORMING SAME

(75) Inventor: Fow-Sen Choa, Baltimore, MD (US)

(73) Assignee: University of Maryland, Baltimore County, Baltimore, MD (US)

(*) Notice: Subject to any disclaimer, the term of this patent is extended or adjusted under 35 U.S.C. 154(b) by 0 days.

(21) Appl. No.: 10/179,287

(22) Filed: Jun. 26, 2002

(65) Prior Publication Data

US 2002/0195597 A1 Dec. 26, 2002

Related U.S. Application Data

(63) Continuation-in-part of application No. PCT/US02/04867, filed on Feb. 20, 2002.
(60) Provisional application No. 60/300,969, filed on Jun. 26, 2001.

(51) Int. Cl.[7] .................................................. H01S 3/14
(52) U.S. Cl. ............................. 372/39; 372/43; 372/44; 372/46; 372/54
(58) Field of Search .............................. 372/39, 43, 44, 372/46, 54; 257/13–25

(56) References Cited

U.S. PATENT DOCUMENTS

| | | | |
|---|---|---|---|
| 4,939,474 A | | 7/1990 | Eisenstein et al. |
| 5,144,637 A | * | 9/1992 | Koch et al. .................... 372/50 |
| 5,184,247 A | * | 2/1993 | Schimpe ....................... 359/344 |
| 5,238,868 A | * | 8/1993 | Elman et al. ................ 438/511 |
| 5,305,412 A | * | 4/1994 | Paoli ........................... 385/122 |
| 5,545,903 A | * | 8/1996 | Van Der Poel et al. ........ 257/14 |
| 5,763,897 A | | 6/1998 | Sano et al. |
| 5,995,529 A | | 11/1999 | Kurtz et al. |
| 6,013,539 A | * | 1/2000 | Kashima et al. .............. 438/31 |
| 6,150,667 A | * | 11/2000 | Ishizaka et al. ............... 257/21 |
| 6,167,070 A | | 12/2000 | Sakata |
| 6,347,106 B1 | | 2/2002 | Dijaili et al. |
| 6,472,682 B1 | * | 10/2002 | Kuramoto ..................... 257/14 |
| 2002/0101898 A1 | * | 8/2002 | Lo et al. ........................ 372/46 |
| 2003/0002554 A1 | * | 1/2003 | Munakata et al. ............ 372/46 |

FOREIGN PATENT DOCUMENTS

| | | | | |
|---|---|---|---|---|
| JP | 363173381 A | * | 7/1988 | .............. H01S/3/18 |
| JP | 403257820 | * | 11/1991 | ......... H01L/21/203 |
| JP | 406342959 | * | 12/1994 | .............. H01S/3/18 |
| WO | WO 97/45903 | | 12/1997 | |

OTHER PUBLICATIONS

Osowski et al., Broadband emission from InGaAs–GaAs–AlGaAs LED . . . selective–area MOVCD, Electronics Letters, 1995, vol. 3, No. 17, 1498–1499.*

* cited by examiner

*Primary Examiner*—Mary Wilczewski
*Assistant Examiner*—Monica Lewis
(74) *Attorney, Agent, or Firm*—Fleshner & Kim LLP

(57) ABSTRACT

An optical gain medium, and a method for forming the same, is provided that exhibits lower wavelength crosstalk when configured as an optical amplifier than prior art optical gain media. The optical gain medium of the present invention includes a buried heterostructure waveguide fabricated in a multiple quantum well (MQW) region. The MQW region in which the buried heterostructure waveguide is located exhibits a continuously changing bandgap as a function of position along the waveguide direction, preferably such that the gain provided by the optical gain medium changes exponentially as a function of position along the waveguide direction. In a preferred embodiment, the MQW region in which the buried heterostructure waveguide is buried is grown using a selective-area-growth (SAG) technique, and is made up of at least two quantum wells, with at least one of the quantum wells having a size and composition that vary as a function of position along the waveguide direction.

22 Claims, 8 Drawing Sheets

LOW CROSSTALK OPTICAL GAIN MEDIUM AND METHOD FOR FORMING SAME

This application is a continuation-in-part of International (PCT) Application No. PCT/US02/04867, filed Feb. 20, 2002, which is hereby incorporated by reference in its entirety.

This application also claims priority to U.S. Provisional Application No. 60/300,969, filed Jun. 26, 2001, which is hereby incorporated by reference in its entirety.

BACKGROUND OF THE INVENTION

1. Field of the Invention

This invention relates to optical gain media and, more particularly, to a semiconductor optical gain medium that exhibits low crosstalk.

2. Background of the Related Art

There is a continuing need for optical amplifiers and switches for various optical communication applications, such as optical networking, wavelength-division-multiplexing and other telecommunications applications. Semiconductor optical amplifiers (SOAs) are promising candidates for optical amplifiers and switches due to their relatively simple structure, and the ease with which they can be integrated into optical systems.

However, prior SOAs exhibit crosstalk between different wavelength division multiplexed (WDM) channels due to gain saturation effects and short carrier lifetimes. Such crosstalk limits the performance of prior SOAs in WDM systems.

FIG. 1 shows the effect of drive current I on gain saturation effects in SOAs. More particularly, gain saturation effects in SOAs can be reduced by exponentially increasing the drive current $I_1$ through $I_N$ injected into the SOA 50 as a function of position along the waveguide direction (x-axis). Such a scheme would require multiple electrodes 60, and would be very complicated and expensive to implement.

SUMMARY OF THE INVENTION

An object of the invention is to solve at least the above problems and/or disadvantages and to provide at least the advantages described hereinafter.

The present invention provides an optical gain medium, and a method for forming the same, that exhibits lower wavelength crosstalk when configured as an optical amplifier than prior art optical gain media. The optical gain medium of the present invention includes a buried heterostructure waveguide fabricated in a multiple quantum well (MQW) region. The MQW region in which the buried heterostructure waveguide is located exhibits a continuously changing bandgap as a function of position along the waveguide direction, preferably such that the gain provided by the optical gain medium changes exponentially as a function of position along the waveguide direction.

In a preferred embodiment, the MQW region in which the buried heterostructure waveguide is buried is grown using a selective-area-growth (SAG) technique, and is made up of at least two quantum wells, with at least one of the quantum wells having a size and composition that vary as a function of position along the waveguide direction.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
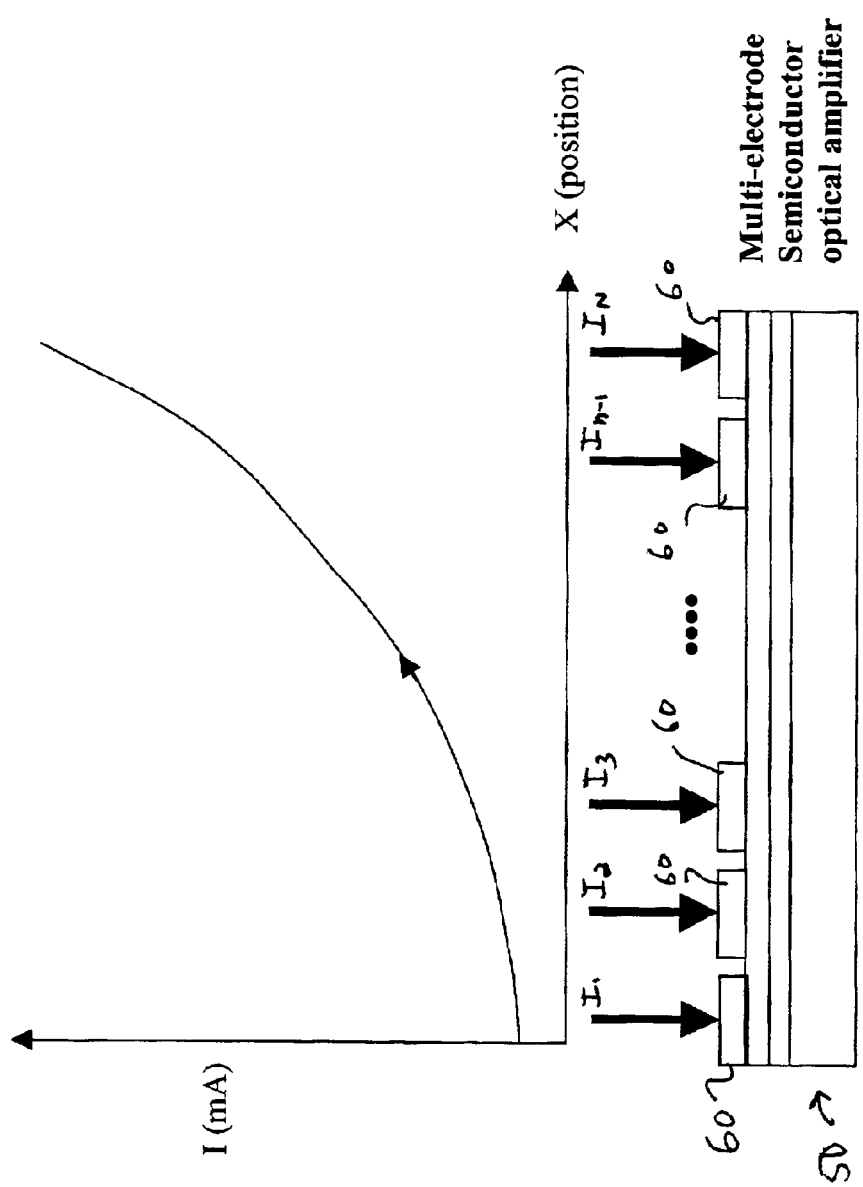
FIG. 1, described above, is a schematic diagram and plot illustrating how exponentially increasing gain can be achieved in a semiconductor optical amplifier by exponentially increasing injected current.
Figure 2A:
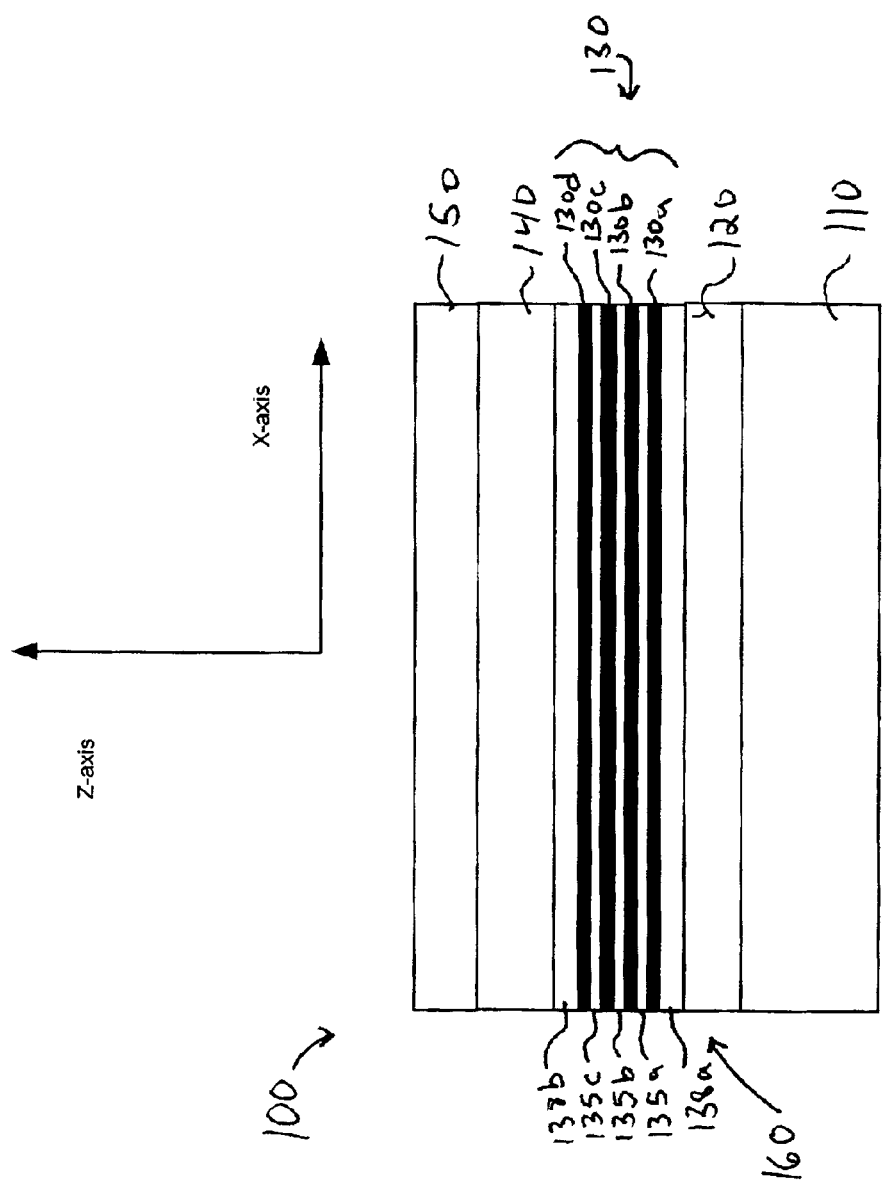
FIGS. 2A–2C are cross-sectional, perspective and plan schematic views, respectively, of a low crosstalk optical gain medium, in accordance with one embodiment of the present invention.
Figure 2B:
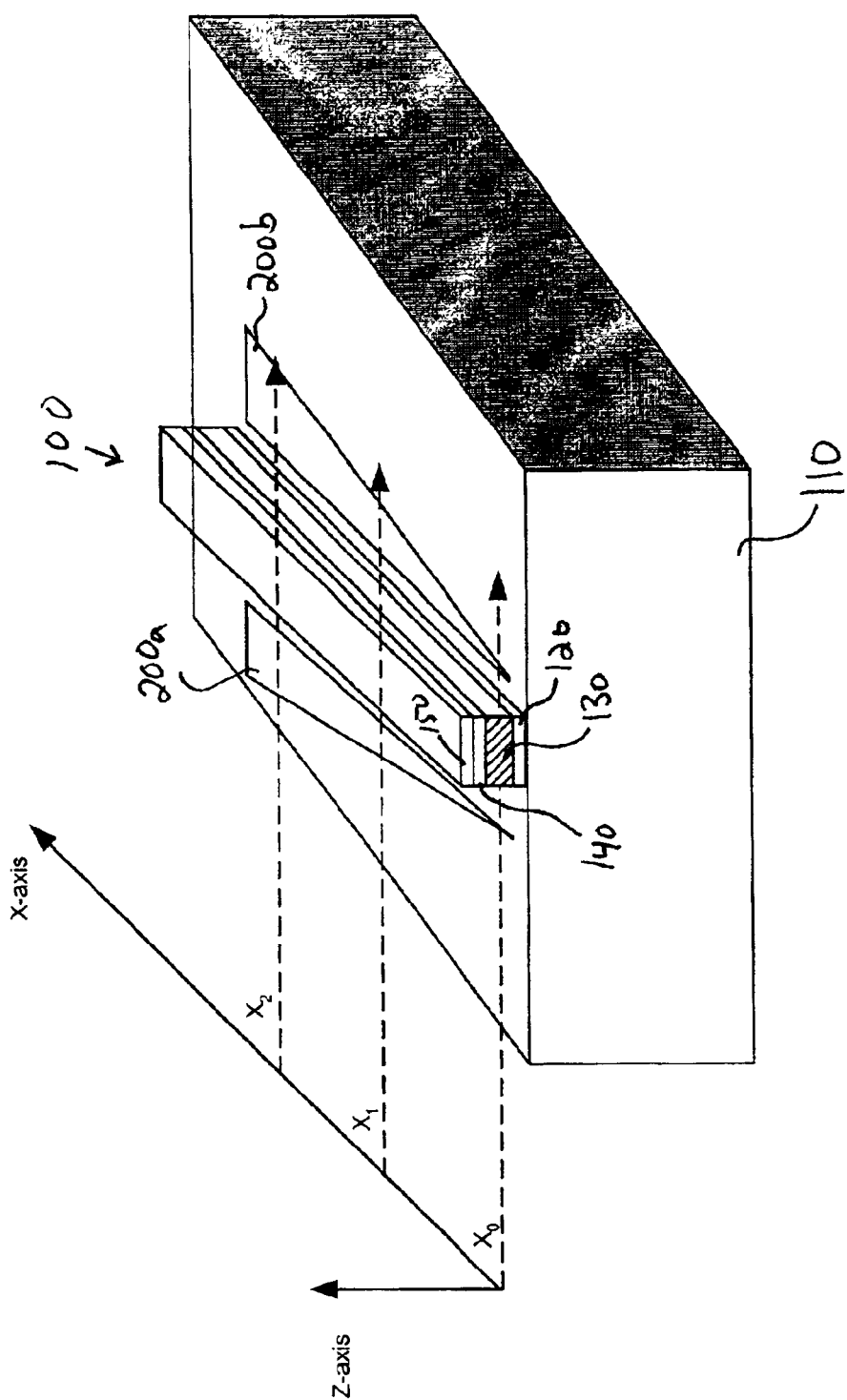
Figure 2C:
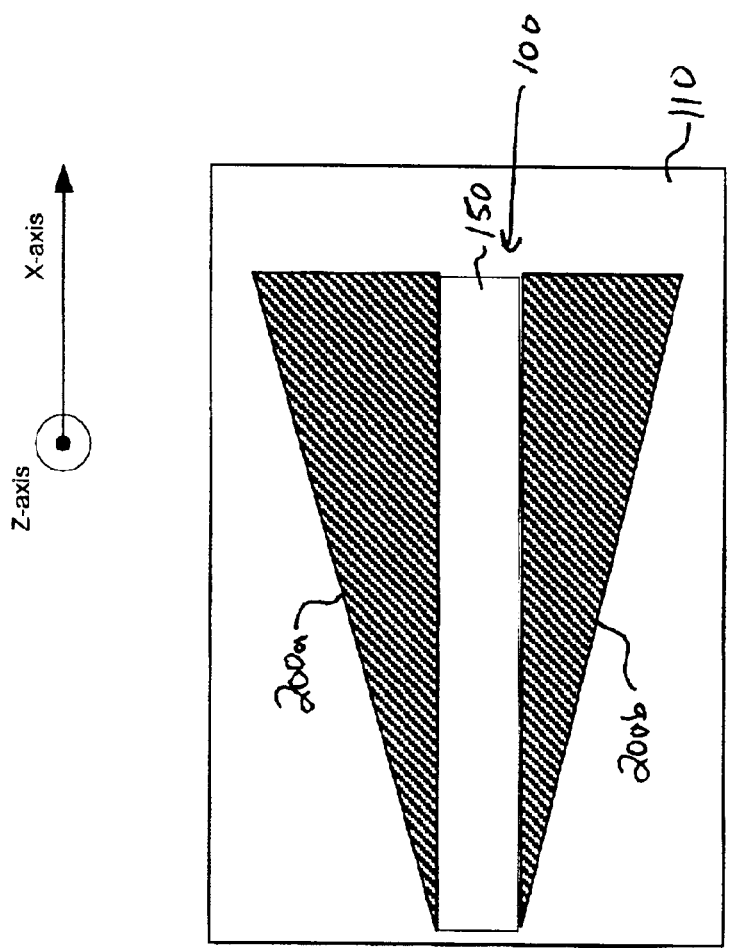

FIGS. 2A–2C are cross-sectional, perspective and plan schematic views, respectfully, of a low crosstalk optical gain medium 100, in accordance with one embodiment of the present invention. The optical gain medium 100 includes a substrate 110, a buffer layer 120, a MQW region 130, optical confinement layers 138a and 138b, a cladding layer 140 and a contact layer 150.

In a preferred embodiment, the substrate 110 is an n-doped InP substrate, the buffer 120 is a n-doped InP buffer layer, the MQW region 130 is an InGaAsP/InGaAs MQW, the cladding layer 140 is a P-doped InP layer, the contact layer 150 is a P-doped InGaAs layer, and the optical confinement layers 138a and 138b are InGaAs layers. However, other materials can be used for the substrate 110, the buffer layer 120, the MQW 130, the cladding layer 140, the contact layer 150 and the optical confinement layers 138a and 138b, while still falling within the scope of the present invention.

The MQW region 130 preferably comprises four quantum wells 130a–130d, preferably InGaAsP quantum wells, separated by three barriers 135b–135c, preferably InGaAs bafflers. The two optical confinement layers 138a and 138b, preferably approximately 55 nm thick, define the buried heterostructure waveguide. The MQW region 130 and optical confinement layers 138a and 138b are preferably formed using standard metalorganic chemical vapor deposition (MOCVD) techniques.

At least one of the quantum wells 130a–130d has a continuously changing bandgap as a function of position along the waveguide direction (the x-axis as shown in FIGS.

2A–2C). This is preferably accomplished by fabricating at least one of the quantum wells 130a–130d using selective-area-growth (SAG) techniques. The quantum well grown using SAG techniques will exhibit a non-constant "thickness profile" and a non-constant material composition that each vary as a function of position along the x-axis.

The term "thickness profile", as used herein, refers to the thickness of the quantum well (measured along the z-axis) at all positions along the waveguide direction (x-axis). Thus, a quantum well with a constant thickness profile has a substantially constant thickness along its entire length (along the x-axis), while a quantum well with a non-constant thickness profile has a thickness that changes as a function of position along the x-axis.

In a preferred embodiment, each of the quantum wells 130a–130d in the MQW region 130 is grown using SAG techniques, and thus each of the quantum wells 130a–130d preferably has a non-constant thickness profile and a composition that varies as a function of position along the x-axis. The thickness of each of the quantum wells 130a–130d preferably starts at an initial value at one end 160 of the MQW region 130, and increases as a function of position along the x-axis. The thickness increase along the x-axis will be explained in more detail below.

With SAG, growth inhibition from a mask, preferably an $SiO_2$ mask, is used to enhance the growth rate between the mask regions. During MOCVD, no deposition takes place on the mask, therefore growth rate enhancement occurs in the unmasked regions.

As shown in FIGS. 2B and 2C, a preferred mask for selected area growth of each of the quantum wells 130a–130d comprises a symmetric pair of tapered $SiO_2$ stripes 200a and 200b that are deposited and patterned on the substrate 110 using standard photolithographic techniques.

For a given separation between each of the $SiO_2$ stripes 200a and 200b, the width of the $SiO_2$ stripes and the separation (gap) between them determines the growth rate enhancement in the region between the stripes 200a and 200b. Because each $SiO_2$ stripe 200a and 200b is tapered, the quantum wells 130a–130d and barriers 135a–135c grown between the stripes 200a and 200b will exhibit a variation in thickness along their length for any predetermined growth time. This produces the non-constant thickness profile.

In addition, the width of the $SiO_2$ oxide stripes 200a and 200b determines the material composition of the quantum well layers and barrier layers grown between the stripes. In the case of an $In_{1-x}Ga_xAs_{1-y}P_y$ quantum well, the quantum well becomes more Indium and Arsenide rich (smaller x and y) as the width of the $SiO_2$ oxide stripes 200a and 200b increases. In the case of an $In_{1-x}Ga_xAs$ barrier layer, the barrier layer becomes more Indium rich (smaller x) as the width of the SiO2 oxide stripes 200a and 200b increases.

In a preferred embodiment, the $SiO_2$ stripes 200a and 200b are each approximately 400 microns long along the x-axis, and are each linearly tapered with a 60 micron in width at their widest point. The separation the $SiO_2$ stripes 200a and 200b is preferably 14–20 microns. The $SiO_2$ stripes 200a and 200b are shown in FIGS. 2B and 2C for illustrative purposes. It should be appreciated that the oxide stripes are typically removed after fabrication of the optical gain medium 100. Further, it should be appreciated that a portion of the MQW region 130 will be grown outside the SAG region defined by the $SiO_2$ stripes. In the sections outside the SAG region, the quantum wells will have a substantially constant thickness profile, and thus a substantially constant bandgap as a function of position along the x-axis. In a preferred embodiment, each of the quantum wells 130a–130d in the sections outside the SAG region are approximately 2.5 nm thick, and the barriers 135a–135c in the sections outside the SAG region are each approximately 7.0 nm thick. In the SAG region, each quantum well 130a–130d preferably has a thickness that varies from approximately 2.5 nm to approximately 6.0 nm as a function of position along the x-axis. For purposes of illustration, FIGS. 2A–2C show only the quantum wells in the SAG region.

In addition to each quantum well in the MQW region 130 having a non-constant thickness profile and a non-constant material composition, the growth time used for at least one of the quantum wells 130a–130d can be optionally different than the growth time used for the other quantum wells, so that at least one of the quantum wells has a different thickness profile than the other quantum wells. A quantum well with a different thickness profile than the other quantum wells will exhibit a different thickness than the other quantum wells at all points along the x-axis.

The variation in thickness and material composition along the x-axis exhibited by each of the quantum wells, which is preferably obtained by using SAG growth techniques, results in a varying bandgap as a function of position along the x-axis for each of the quantum wells 130a–130d. This, in turn, varies the wavelength of peak gain as a function of position along the x-axis, thereby producing a broader gain spectrum in the gain medium 100.

Figure 3:
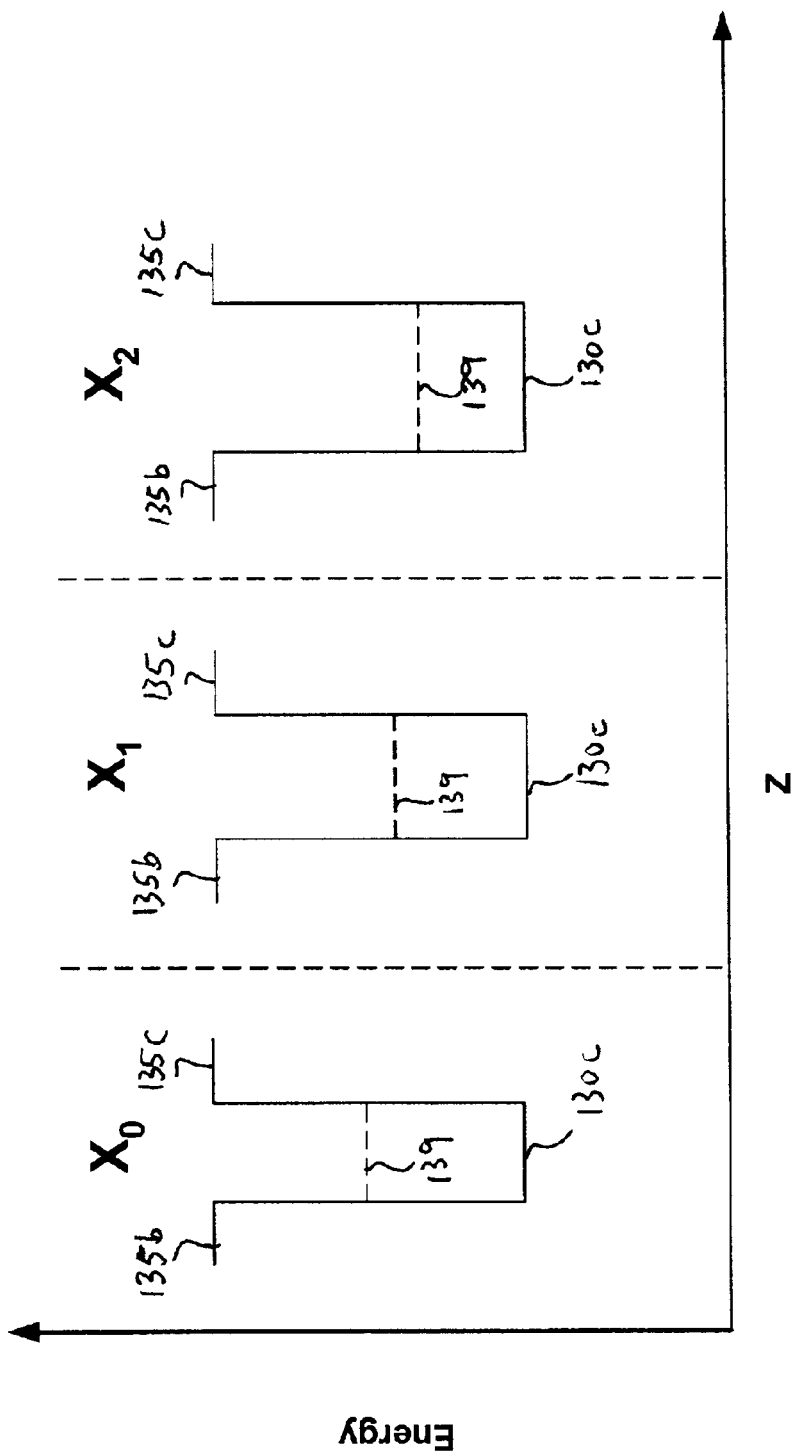
FIG. 3 is a schematic representation of the conduction and valence bands of one of the quantum wells in the optical gain medium of FIGS. 2A–2C, at three points along the waveguide direction, in accordance with the present invention.

The variation in the bandgap of the quantum wells 130a–130d caused by each quantum well having a non-constant thickness profile and non-constant material composition is shown schematically in FIG. 3, which is a schematic representation of the conduction and valence bands for quantum well 130c, as a function of position along the z-axis, at x-axis positions $X_0$, $X_1$, and $X_2$. For ease of illustration, only quantum well 130c is represented in FIG. 3. The same principles apply to the other quantum wells that have a non-constant thickness profile and non-constant material composition.

As shown in FIG. 3, each individual quantum well has a thickness that increases along the x-axis, as well as a material composition that varies as a function of position along the x-axis. Thus, the valance band energy 139 of the quantum well 130c gets progressively lower along the x-axis.

Figure 4:
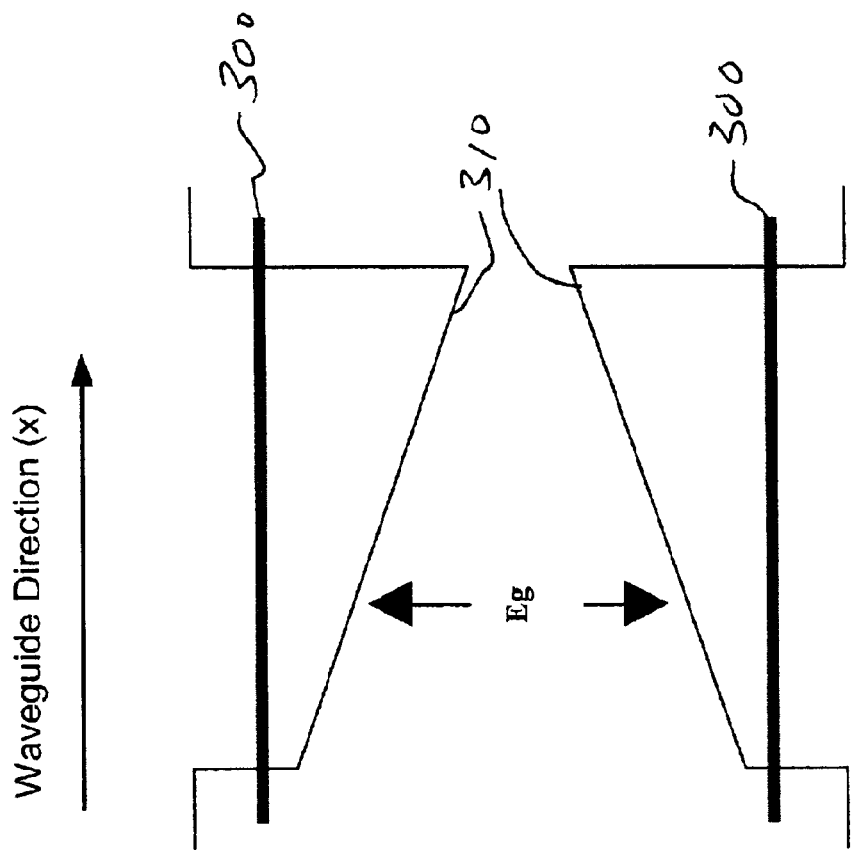
FIG. 4 is a schematic representation of the bandgap of the optical gain medium of FIGS. 1A–1C, in accordance with the present invention.

FIG. 4 is a schematic diagram illustrating the bandgap ($E_g$) as a function of position along the waveguide direction (x), for the gain medium 100 of the present invention. With a constant injected current, the Fermi level 300 is the same all along the waveguide direction. Because the carrier concentration is exponentially proportional to the difference between the Fermi level 300 and the band edge 310, the carrier distribution along the waveguide direction increases exponentially from the larger bandgap side to the smaller bandgap side.

If multi-channel WDM signals are injected into the gain medium 100 from the shorter wavelength side (larger bandgap side), they will experience an exponentially increasing gain profile along the waveguide direction. In this configuration, the optical gain will not saturate, and crosstalk effects are therefore reduced. If multi-channel WDM signals are injected into the gain medium 100 from the longer wavelength side (smaller bandgap side), they will experience an exponentially decreasing gain profile along the waveguide direction. In this configuration, ultrafast wavelength conversions can be achieved. Thus, the gain medium 100 of the present invention, can function as a low crosstalk optical amplifier or a wavelength conversion material, depending on which direction the optical signal propagates through the gain medium 100.

Figure 5:
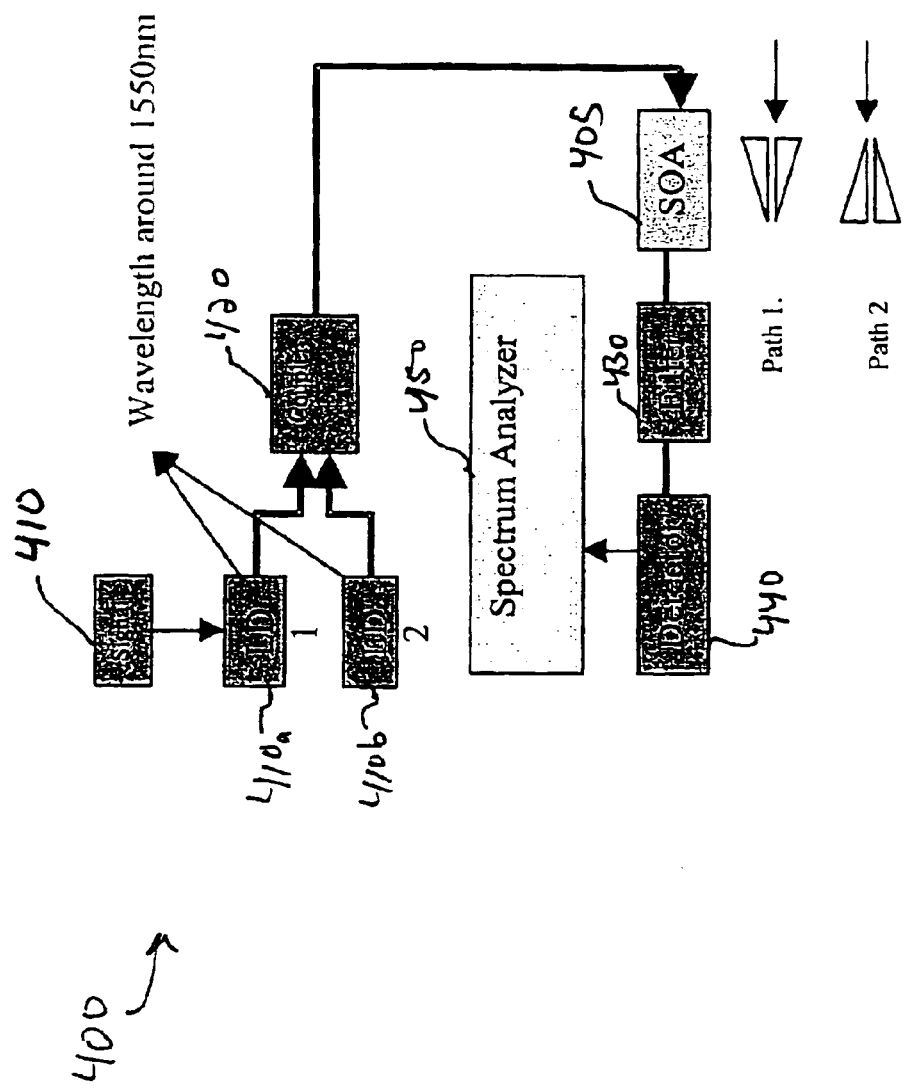
FIG. 5 is a schematic diagram of a system used to test an SOA that incorporates the optical gain medium of the present invention.

FIG. 5 is a schematic diagram of a system 400 used to test an SOA 405 that incorporates the optical gain medium of the present invention. The system includes a frequency sweeper 410, optical sources 410a and 410b, preferably laser diodes (LDs), a coupler 420 for coupling the outputs of the optical sources 410a and 410b into the SOA 405, a filter 430 that passes only the wavelengths of the optical sources 410a and 410b, a detector 440 that detects the optical signal passed by the filter 430 and converts the optical signal into an electrical signal, and a spectrum analyzer 450 that frequency analyzes the signal from the detector 440.

Figure 6:
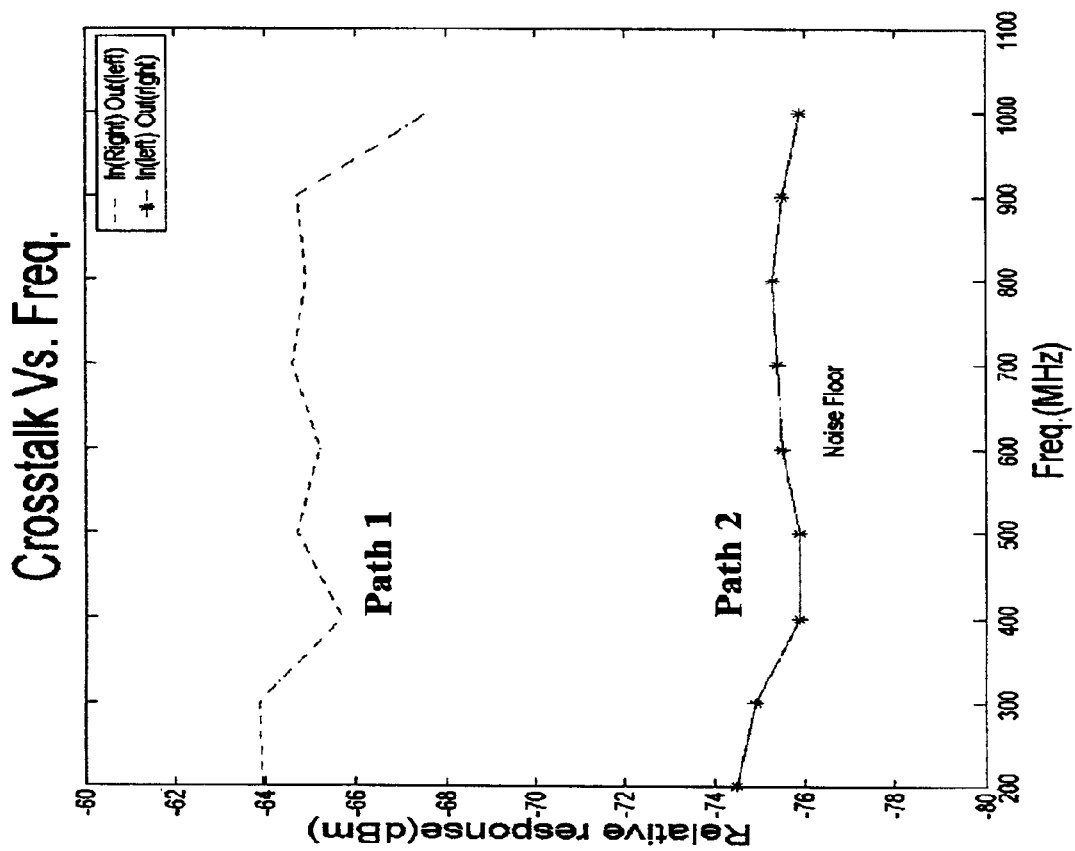
FIG. 6 are plots of crosstalk as a function of frequency exhibited by an SOA incorporating the optical gain medium of the present invention, for two signal propagation directions.

Optical sources 410a and 410b emit at different wavelengths close to 1550 nm. Optical source 410a is modulated with frequency sweeper 410. The crosstalk exhibited by the SOA 405 as a function of frequency is shown in the plots of FIG. 6 for two signal propagation directions in the SOA. When the optical signals from the optical sources 410a and 410b propagate through the waveguide in the SOA 405 from the large bandgap side to the small bandgap side (Path 2), there is no detectable crosstalk between the two optical signals. The curve shown for Path 2 represents the noise floor. When the optical signals from the optical sources 410a and 410b propagate through the waveguide in the SOA 405 from the small bandgap side to the large bandgap side (Path 1), there is significant crosstalk between the optical signals. In this configuration, the SOA 405 can function as a wavelength conversion material.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

For example, although an InGaAs/InGaAsP multiple quantum well region has been described and illustrated as one embodiment, other types of multiple quantum well regions, such as InAlGaAs/InGaAs and AlGaSb/GaSb multiple quantum well regions, can be used while still falling within the scope of the present invention.

Further, the embodiment described and illustrated above includes four quantum wells, with each quantum well having a non-constant thickness profile. In addition, each of the quantum wells in the above-described embodiment exhibits a different thickness profile. It should be appreciated that any multiple quantum well region can be used, as long as at least one of the quantum wells has a non-constant thickness profile, and at least one of the quantum wells has a thickness profile that is different than the other quantum wells. For example, the present invention can be practiced in whole or in part by a multiple quantum well region that includes three quantum wells, with only one of the quantum wells having a non-constant thickness profile, and one of the quantum wells having a thickness profile that is different than the thickness profile of the other two quantum wells.

In addition, in the embodiment described and shown above, the non-constant thickness profile is obtained by using SAG fabrication techniques, and the thickness profile of each of the quantum wells is made different from the others by varying the growth time of each quantum well layer. However, other techniques known in the art for achieving these thickness parameters may be used while still falling within the scope of the present invention. In the claims, means-plus-function clauses are intended to cover the structures described herein as performing the recited function and not only structural equivalents but also equivalent structures.

What is claimed is:

1. An optical gain medium, comprising:
   a substrate;
   a multiple quantum well (MQW) region on the substrate comprising at least two quantum wells that is configured to guide an optical signal, wherein an optical gain provided by the MQW region changes exponentially as a function of position along a waveguide direction when a substantially constant current is injected into the MQW region.

2. The optical gain medium of claim 1, wherein the MQW region comprises an InGaAsP/InGaAs quantum well region.

3. The optical gain medium of claim 1, wherein the MQW region comprises a plurality of InGaAsP quantum wells, wherein respective InGaAs layers are positioned between adjacent InGaAsP quantum wells.

4. The optical gain medium of claim 1, wherein at least one of the quantum wells has a non-constant thickness profile and a non-constant material composition.

5. The optical gain medium of claim 1, wherein each of the quantum wells has a non-constant thickness profile and a non-constant material composition.

6. The optical gain medium of claim 5, wherein at least one of the quantum wells has a thickness profile that is different than a thickness profile of the other quantum wells.

7. The optical gain medium of claim 1, wherein each quantum well has a different and non-constant thickness profile and a non-constant material composition.

8. The optical gain medium of claim 5, wherein each quantum well has a thickness that increases along the waveguide direction.

9. The optical gain medium of claim 8, wherein each quantum well has a thickness that varies from approximately 2.5 nm to approximately 6.0 nm as a function of position along the waveguide direction.

10. The broadband gain medium of claim 7, wherein each quantum well has a thickness that increases along the waveguide direction.

11. A semiconductor optical amplifier comprising the optical gain medium of claim 1.

12. A wavelength converter comprising the optical gain medium of claim 1.

13. An optical gain medium, comprising:
    a substrate;
    a buffer layer on the substrate;
    a multiple quantum well (MQW) region on the buffer layer comprising at least two quantum wells that are configured to guide an optical signal, wherein an optical gain provided by the MQW region changes exponentially as a function of position along a waveguide direction when a substantially constant current is injected into the MQW region; a cladding layer on the MQW region; and
    a contact layer on the cladding layer.

14. The optical gain medium of claim 13, wherein the substrate comprises an n-doped InP substrate, the buffer layer comprises an n-doped InP buffer layer, the MQW region comprises an InGaAsP/InGaAs MQW region, the cladding layer comprises a p-doped InP layer, and the contact layer comprises a p-doped InGaAs layer.

15. The optical gain medium of claim 13, wherein the MQW region comprises a plurality of InGaAsP quantum wells, and respective InGaAs layers positioned between adjacent InGaAsP quantum wells.

16. The optical gain medium of claim 13, wherein the MQW region comprises:
- a first InGaAs optical confinement layer on the buffer layer;
- a first InGaAsP quantum well on the first InGaAsP optical confinement layer;
- a first InGaAs barrier layer on the first InGaAsP quantum well;
- a second InGaAsP quantum well on the first InGaAsP barrier layer;
- a second InGaAs barrier layer on the second InGaAsP quantum well;
- a third InGaAsP quantum well on the second InGaAs barrier layer;
- a third InGaAs barrier layer on the third InGaAsP quantum well;
- a fourth InGaAsP quantum well on the third InGaAs barrier layer; and
- a second InGaAs optical confinement layer on the fourth InGaAsP quantum well.

17. The optical gain medium of claim 13, wherein at least one of the quantum wells has a non-constant thickness profile and a non-constant material composition.

18. The optical gain medium of claim 13, wherein each of the quantum wells has a non-constant thickness profile and a non-constant material composition.

19. The optical gain medium of claim 18, wherein at least one of the quantum wells has a thickness profile that is different than a thickness profile of the other quantum wells.

20. The optical gain medium of claim 13, wherein each of the quantum wells has a different and non-constant thickness profile, and a non-constant material composition.

21. The optical gain medium of claim 18, wherein each of the quantum wells has a thickness that increases along the waveguide direction.

22. The optical gain medium of claim 21, wherein each quantum well has a thickness that varies from approximately 2.5 nm to approximately 6.0 nm as a function of position along the waveguide direction.

* * * * *